Sept. 27, 1966 F. W. GUTZWILLER 3,275,909

SEMICONDUCTOR SWITCH

Filed Dec. 19, 1963 2 Sheets-Sheet 1

INVENTOR:
FRANK W. GUTZWILLER,

BY Urban H. Faubion
HIS ATTORNEY.

Sept. 27, 1966 F. W. GUTZWILLER 3,275,909

SEMICONDUCTOR SWITCH

Filed Dec. 19, 1963 2 Sheets-Sheet 2

INVENTOR:
FRANK W. GUTZWILLER,
BY *Urban H. Faubion*
HIS ATTORNEY.

United States Patent Office 3,275,909
Patented Sept. 27, 1966

3,275,909
SEMICONDUCTOR SWITCH

Frank W. Gutzwiller, Auburn, N.Y., assignor to General Electric Company, a corporation of New York Filed Dec. 19, 1963, Ser. No. 331,776
4 Claims. (Cl. 317—235)

This invention relates to bilateral semiconductor switches of the type which can be switched between two states of impedance, i.e., between a high impedance and a low impedance for current conduction in both directions through the semiconductor device.

Semiconductor switches have become an important component in a wide variety of control applications, particularly PNPN three terminal devices of the type frequently referred to as silicon controlled rectifiers. Operation of such devices is described in Chapter 1 of the General Electric Controlled Rectifier Manual, second edition, copyright 1961 by the General Electric Cmpany, the article by Moll, Tanenbaum, Goldey and Holonyak in Proceedings of the IRE, September 1956, volume 44, pages 1174 to 1182, and in the copending patent application, Serial Number 838,504, entitled, Semiconductor Devices and Methods of Making Same, filed September 8, 1959, in the name of Nick Holonyak, Jr., and Richard W. Aldrich and assigned to the assignee of the present application.

The SCR is made an active element in the circuit by connecting two of its three terminals (its anode and cathode terminals) in the circuit to be controlled. With the switch in its "off" condition the rectifier acts as a high impedance element. Except for a very small leakage current, the switch acts as an open circuit. When the switch is in its "on" condition, it presents a very low impedance (essentially a short circuit) to current flowing in one direction but still acts as a high impedance element to current in the opposite direction. The usual mechanism for rendering the SCR conductive is to introduce current into a third lead or terminal (called the triggering or gate lead) which increases the current flowing through the device and thereby renders the device conductive. This action is descriptively referred to as triggering the device or turning it on.

From the above description, it is seen that the SCR is essentially a unidirectional control element. That is, a single SCR is a device which blocks one-half cycle of an alternating current source and exercises control during the other half cycle. In order to exercise full-wave power control, two or more SCRs must be used or the alternating source must be rectified to provide a pulsating unidirectional wave. This, for many applications, makes it difficult to justify the use of SCR control on an economic basis. This is particularly true for very simple functions such as an on-off switching and manual adjustment of power level.

An object of the present invention is to provide a semiconductor device which gives full wave power control of an alternating current. Since the device conducts in both directions, it can be designed to be self-protecting against voltage transients and does not then require special protective circuitry. Further, the single device performs functions usually requiring two or more SCRs. Consequently, economics are in favor of the three-lead bilateral switch of the present invention in fullwave control of alternating current voltages. Certainly, the single device takes less space and requires fewer connections than the units which it displaces.

The bilateral two-lead (diode) semiconductor switch as described in the copending Holonyak patent application, supra, represents one attempt to accomplish the objects of this invention. While the diode semiconductor switch is a signifficant advance, it suffers from a number of disadvantages which the present invention avoids. For example, the three-lead bilateral switch requires less trigger power and, in general, fewer and less sophisticated circuit components for triggering. In addition, operating parameters such as breakover voltages and the minimum current required to keep the device in conduction once fired (holding current) are less critical in typical applications for the three-lead device.

The copending Holonyak patent application, supra, also describes a bilateral three terminal semiconductor switch which provides control of both half cycles of an alternating source from a single gate terminal. This device also represents an extremely significant advance but has the disadvantage that the gate terminal must be referenced to one main terminal to control conduction in one direction and the other main terminal to control conduction through the device in the opposite sense. It is preferable to be able to control conduction in both directions by referencing the gate terminal to only one of the main device terminals. In fact, a device which does not meet this criterion may not be practical for many circuit applications.

In carrying out the present invention, a single three-lead (three terminal) semiconductor device is provided which controls both parts of the output of an alternating power source and thus eliminates the need for two or more unilateral switching devices. In addition, the device may be connected to provide four terminals including two gate terminals. This is accomplished by providing in one semiconductor pellet an integrated circuit which incorporates the functions of a pair of controlled rectifiers connected to provide control of an alternating power source and requires only one gate terminal to control firing for either direction of conduction. In addition, the single gate terminal need be referenced to only one of the two main terminals. The two gate terminal configuration selective gating polarities and directions (still referenced to only one of the two main terminals) may be used. In accordance with one aspect of the invention, the structure for the integrated circuitry includes a single semiconductor pellet which incorporates three contiguous regions of opposite conductivity type defining two intermediate rectifying junctions. On each of the external regions of the three regions but not coextensive therewith, at least one other region (called an external emitter region) is provided which is of opposite conductivity type and thus forms another rectifying junction with the adjacent regions. Thus, the pellet has five regions and four intermediate rectifying junctions. Main current carrying terminals or contacts are provided which contact both the external emitter regions and the next internal region (external region of the three regions) so that each of the junctions between the external emitters is a shorted junction and the device thus far described is similar to a five-layer two-lead bilateral switch. Gate contacts are provided by a direct ohmic gate contact to one of the outer regions of the three (an internal base region) and to an additional region of opposite conductivity type adjacent to the same layer. These two gate contacts are electrically connected to a single gate terminal if only three terminals are desired.

The features which are believed to be characteristic of the invention are set forth with particularity in the appended claims. The invention itself, however, both as to its organization and advantages thereof may best be understood by reference to the following description taken in connection with the accompanying drawings in which:

Figure 1:
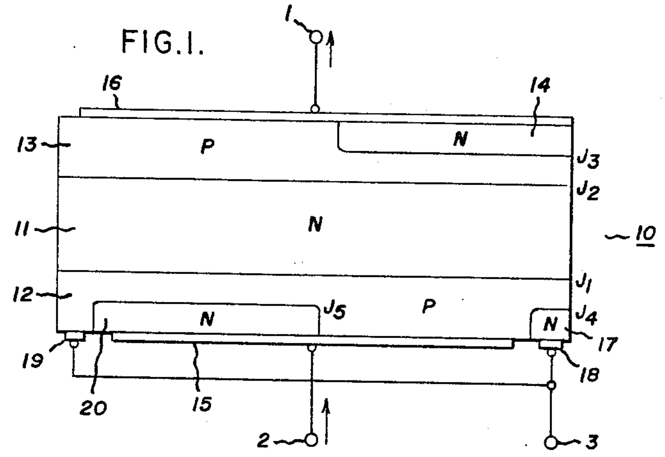
FIGURE 1 is a diagrammatic sectional view of a three-lead bilateral semiconductor switch device constructed in accordance with the principles of this invention showing symbols used in explaining the device switching mechanism.
Figure 2:
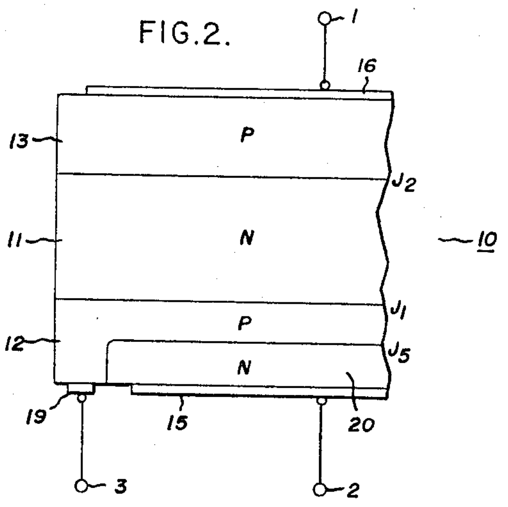
FIGURES 2 and 4 are segments of the device of FIGURE 1 used in explaining the operation of the device (section lines are not shown in FIGURE 1 to avoid cluttering the drawings)
Figure 3:
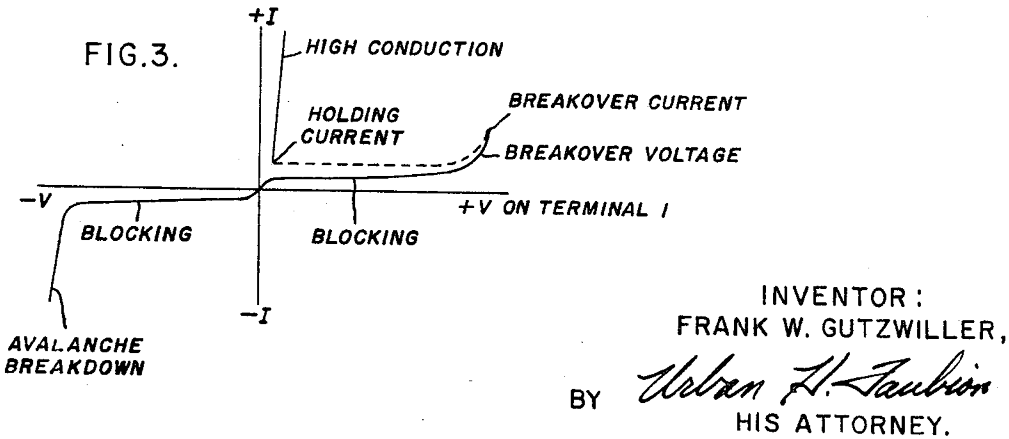
Figures 4, 5:
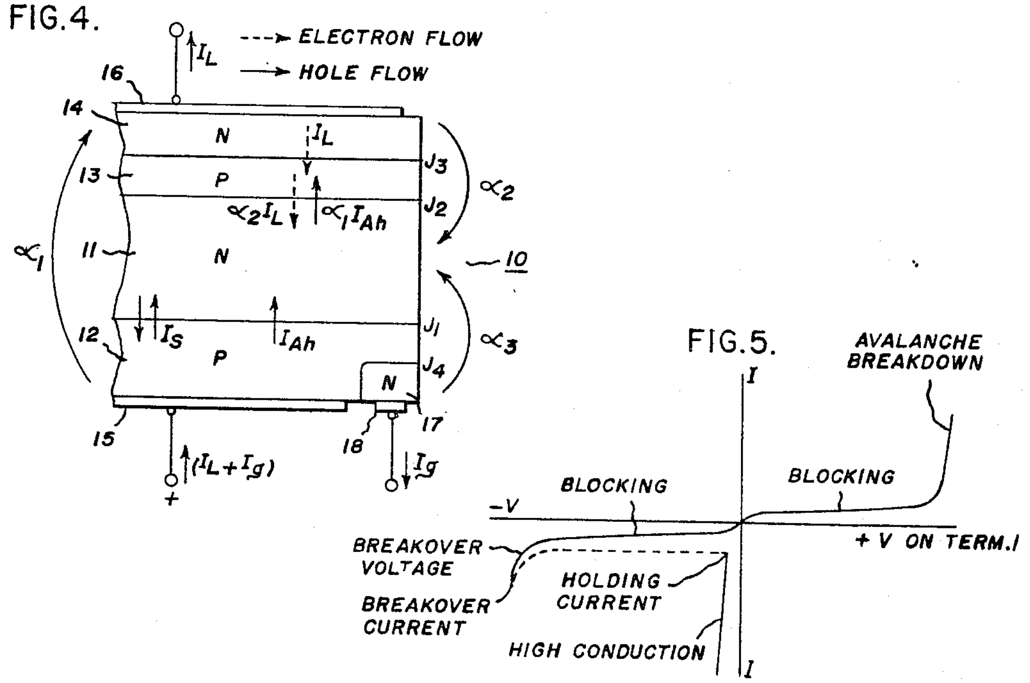
Figure 6:
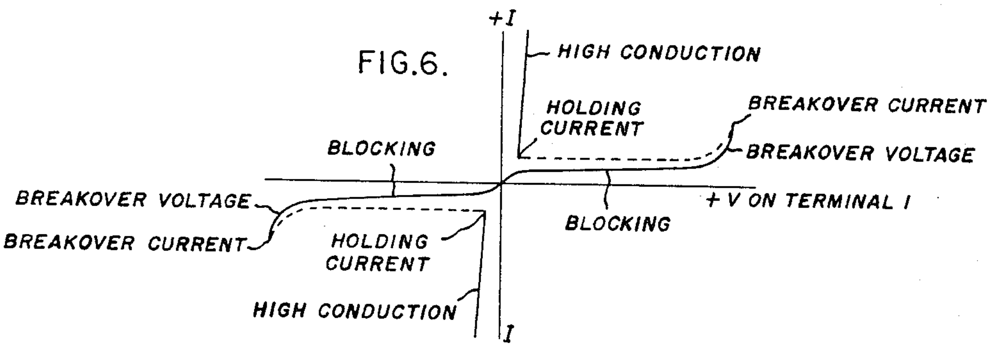
Figure 7:
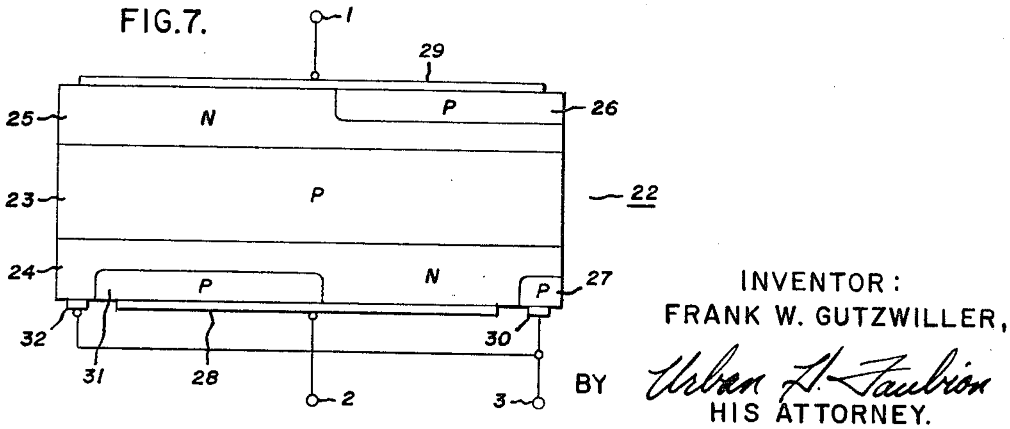

FIGURES 3, 5 and 6 are voltage-current characteristics of the segments of FIGURES 2 and 4 and the device of FIGURE 1 respectively with device current plotted along the axis of ordinates and device voltage plotted along the axis of abscissas; and FIGURE 7 is a diagrammatic sectional view of a three-lead bilateral switch which constitutes the dual or complementary structure of the device of FIGURE 1.

One embodiment of a practical device constructed in accordance with the invention is illustrated somewhat schematically in FIGURE 1. As illustrated, the device has three terminals 1, 2 and 3 which are intended to be connected in the circuit where the switch is employed. In each case, the upper and lower main current carrying terminals 1 and 2 respectively are connected in a main current carrying path of the circuit and gating terminal 3 is connected to a source which supplies a turn-on signal of proper polarity when the current path between the main terminals 1 and 2 is to be rendered highly conductive. When upper main terminal 1 is positive relative to lower main terminal 2, the device is turned on by applying a turn-on voltage at gate terminal 3 which is positive relative to the lower main terminal 2. When the reverse polarity is applied between main terminals 1 and 2 the device is switched on by applying a gate voltage which is negative relative to lower main terminal 2.

In the embodiment illustrated in FIGURE 1, the semiconductor pellet 10 may be considered a five-layer device and has an internal N conductivity type base region or layer 11 and P conductivity type regions or layers 12 and 13 on opposite sides. The two P type layers 12 and 13 perform different functions for conduction in opposite senses through the pellet 10. For example, when the lower main terminal 2 is positive relative to upper terminal 1, the lower (i.e. lower in the figure) P type layer 12 operates as an emitter and the junction $J_1$ between the lower P type layer 12 and internal N type layer 11 is considered an emitter junction. Under these conditions, the upper (internal) P type region 13 constitutes a base region which is separated from the N type base region by junction $J_2$. When the polarity between the main terminals is reversed, the upper P type layer 13 constitutes an emitter and the lower P type layer 12 constitutes an internal base layer.

An upper N conductvity type region or layer 14 is formed adjacent or contiguous with a portion of the internal P type base layer 13 and is separated therefrom by junction $J_3$. When the lower device terminal 2 is positive relative to upper terminal 1, upper N type region 14 constitutes an emitter region and the adjacent junction $J_3$ an emitter junction. In order to provide a corresponding emitter and emitter junction for conduction in the opposite sense, (i.e., upper terminal 1 to lower terminal 2), a lower N conductivity type region 20 is formed adjacent or contiguous with a part of lower P type layer 12 and forms a rectifying junction $J_5$ (emitter junction for this polarity). The lower N type region 20 is only contiguous with a part of the lower P type region 12 and is spaced from the sides of the pellet to leave exposed surface areas of the P type region 12 on both sides.

The contacts for the main current conduction path through the device is made by providing low resistance ohmic contacts 15 and 16 on the lower and upper major faces respectively of the pellet 10. The lower electrode or contact 15 contacts the lower external N type region 20 and an exposed portion of the next adjacent (lower) P type layer 12 and thus shorts the junction $J_5$. Note that this contact 15 does not extend to either edge of the pellet

10. The upper electrode 16 extends over the external N type layer 14 and the exposed portion of upper P type layer 13 and thus shorts the upper junction $J_3$. The electrodes 15 and 16 are electrically connected to main terminals 2 and 1 respectively. The device thus far described constitutes a five-layer device with upper and lower shorted emitter and thus constitutes a five-layer two-lead bilateral switch as described in the Holonyak et al. copending patent application supra and the R. W. Aldrich and N. Holonyak, Jr. article, "Two-Terminal Asymmetrical and Symmetrical Silicon Negative Resistance Switches," in Journal of Applied Physics, vol. 30, No. 11, pp. 1819–1824, November 1959.

In order to provide improved control, two gate connections are provided. An N type gate region 17 is provided adjacent to the portion of lower P type layer 12 near to the main electrode (shorting contact) 15 and a low resistance ohmic contact or electrode 18 is formed on the gate region in order to provide a means of electrical connection to gate terminal 3. The other gate electrode 19 is a low resistance ohmic connection to the lower P type layer 12 adjacent the external N type layer or region 20 but on the opposite side of the zone from the region where the main electrode 15 extends over to connect to lower P type layer 12. The object in making the two connections remote is to provide a relatively high resistance between terminals 2 and 3 and thus prevent an electrical short between them. Since the distance from gate electrode 19 through P region 12 over the external N type region 20 to the portion of main electrode 15 on the P region 12 is sufficient to provide a high resistance path, the two electrodes 19 and 15 are, therefore, considered electrically or conductively remote. Both gate electrodes 18 and 19 are connected to gate terminal 3.

Formation of the N type gate region 17 adjacent or in lower P type emitter region provides a rectifying junction $J_4$ therebetween. This gate region 17, in effect, forms a transistor with lower P type region 12 and N type base region 11 which includes junction $J_4$ and $J_1$. Further, since the N type gate region 17 acts as a separate emitter under certain conditions, it is called a remote gate.

In order to understand how the device of FIGURE 1 operates, consider the pellet 10 in two sections as illustrated in FIGURES 2 and 3. For purposes of explaining device operation, the section of pellet 10 illustrated in FIGURE 2 is considered as an SCR and the section of pellet 10 illustrated in FIGURE 3 is considered a remote gate SCR as described in the copending patent application of F. E. Gentry and Bernard R. Tuft, Serial Number 326,162 filed November 26, 1963, entitled "Semiconductor Switch" and assigned to the assignee of the present invention. Although the analysis may not be rigorously correct, it should suffice to explain the device operation.

Consider first FIGURE 2 where the left hand segment of pellet 10 is shown as a unit which is unmistakably an SCR. Since the SCR is well known and its operation described in publications, e.g. SCR Manual, second edition, copyright 1961 by the General Electric Company, only a cursory discussion of the device characteristics and the turn-on mechanism is given here.

Assume a voltage applied between main terminals 1 and 2 which is positive at terminal 1 relative to terminal 2. This condition presents a positive potential at upper P type emitter layer 13 and a negative potential at the lower N type emitter layer 20. It is seen that the junctions between the two outer end layers (at both ends) tend to conduct since the positive potential at P type layer 13 tends to cause P type carriers to move across emitter junction $J_2$ for collection at the center junction $J_1$ and the negative potential at the lower N type emitter tends to cause the negative carriers to move across lower emitter junction $J_5$ for collection at center junction $J_1$. The center junction, $J_3$, between the N and P type layers 11 and 12, however, tends to block current flow through the device. The device can be made to conduct by raising the voltage across it to some high value which forces conduction across the center junction $J_1$. It may also be made to conduct by introducing the proper amount of current through a gate terminal 3 on the lower P type intermediate layer 12 to cause a change of the charge condition across the center junction $J_1$. That is, a voltage applied to gate terminal 3 which is positive relative to lower main terminal 2 causes the lower N type layer (emitter here) 20 to inject electrons into lower P type region 12 (base region here). The electrons are not injected uniformly across the area of the lower emitter junction $J_5$ because the injected electron current density varies exponentially with the voltage between the P and N type layers 12 and 20 respectively on opposite sides of the junction. Since the potential across the junction $J_5$ results from flow of majority carriers (holes in this case) from the gate contact 19, a lateral voltage drop (along the junction $J_5$) occurs in the P type base region 12. Thus, the voltage between the two adjacent regions 20 and 12 is highest near the gate contact 19 and decreases with lateral distance away from it.

The injected electrons diffuse toward the center junction $J_1$ and those collected lower the potential of the internal N type base region 11 relative to the upper P type region 13 (emitter for this section) in the region opposite the electron injection. As a consequence, holes are injected from the upper P type region 13 into internal N type base region 11 and diffuse toward center junction $J_1$. The holes collected at junction $J_1$ raise the potential of lower P type layer 12 relative to the internal N type layer 11 causing further injection of electrons from lower N type region 20 into the adjacent P type region 12. As holes in lower P type region 12 build up, the voltage between between this region and lower N type layer 20 increases, and lateral flow of hole current causes more of P type layer 12 to be positive with the result that more of the area of lower emitter 20 injects electrons. A similar state of affairs occurs in the internal N type base layer 11.

The buildup of mobile charge in the two internal base regions 11 and 12 causes the space charge layer at the center junction $J_1$ to collapse and results in additional current through the device (and load). Thus, the segment continues this positive feedback process until it turns on over its whole area.

From the above description it is appreciated that where selective gate control is desired, the gate electrodes 18 and 19 need not be interconnected but may be used to provide a four terminal device (not shown). With the four terminals and upper main terminal 1 positive relative to lower main terminal 2, the device may be turned on with a voltage at gate electrode 19 which is positive relative to the lower main terminal 2. When the reverse polarity is applied between main terminals 1 and 2, the device may be switched on by applying a gate voltage at gate electrode 18 which is negative relative to lower main terminal 2. From a circuit designer's point of view, this may be advantageous. Since the structure, without modification, offers the possibility of either type of control, it is particularly advantageous.

FIGURE 3 illustrates the typical voltage-current characteristics of an SCR and the characteristics of the section of pellet 10 illustrated in FIGURE 2. Device current is plotted along the axis of ordinates and voltage between main terminals along axis of abscissas. Positive voltage on terminal 1 is plotted to the right and increasing positive voltage on terminal 2 to the left and current from terminal 1 to 2 is considered positive. In the forward blocking direction (positive voltage on terminal 1), increasing the forward voltage does not tend to increase current until the point is reached (Breakover Voltage) where the avalanche multiplication described above begins to take place. Past this point the current increases quite rapidly until the center junction $J_1$ becomes forward biased and the device goes into the high conduction region. In the reverse direction, this segment of the device has two blocking junction $J_2$ and $J_5$ so that it does not go into a high conduction mode (i.e. it is not bilateral). For increasing magnitudes of gate current, the region of characteristics between breakover current and holding current is narrowed and the magnitude of forward breakover voltage is reduced.

For an understanding of portion of the switch of FIGURE 1 which conducts when the voltage is opposite to that described above, (i.e. when main terminal 2 is positive relative to terminal 1) and thus gives the device its bilateral properties, reference may be had to the segment illustrated in FIGURE 4. This portion of the device is a remote gate SCR and is complementary to the SCR section of FIGURE 2 and, therefore, is conductive in the opposite direction.

Assume a positive potential at the main terminal 2 (P type end layer 12 which performs as an emitter in this section) and a negative potential at the cathode contact (N type end layer 14 which also performs as an emitter here). The junctions $J_1$ and $J_3$ (emitter junctions in this section) between the two outer end layers (at both ends) tend to conduct whereas the junction $J_2$ (center junction for this section) between the N and P type base layers 11 and 13 tends to block current flow through the device. That is, the device is in its blocking state. The PNPN device is made to conduct by raising the voltage across it to some high value which forces conduction across the center junction $J_2$. It may also be made to conduct by biasing the contact (via gate terminal 3) negatively with respect to the main contact 15 (via main terminal 2), thus causing a change of the charge condition across the center junction $J_2$.

To expand a little on the operation, when the gate contact 18 is biased negative relative to main contact 15, the N type gate region 17 acts as an emitter and injects electrons into the adjacent P type region 12. The electrons diffuse toward the adjacent junction $J_1$. The space charge layer of the junction $J_1$ is adequate for collection of minority carriers. Thus, the injected electrons are collected at junction $J_1$, and lower the potential of the internal N type base layer 11 relative to the lower P type (emitter) layer 12 causing layer 12 to inject holes into base layer 11. This, in turn, causes, by the same process, a change of reverse or blocking bias across center junction $J_2$ to forward bias and the device conducts as a conventional SCR. In other words, the net result is much the same as if a gate lead were attached directly to the internal N type base layer 11 and a negative bias (negative relative to amode contact 15) applied directly to it. However, on a normal SCR which is reverse biased (terminal 1 positive) the lower emitter junction $J_1$ is blocking; thus, the gate would be at a high potential with respect to terminal 2 during this period. With the remote gate structure just described the voltage applied to the internal N type base region 11 during the reverse half cycle does not appear on the gate terminal.

A better understanding of the device operation may be had by considering the internal and external currents. In equation form:

(1)

$$I_L = \alpha_1 I_{AH} + \alpha_2 I_L + I_S$$

where $I_L$ is load current (see FIGURE 4), $I_S$ is current across center junction $J_2$ when in forward bias (thermally generated current), $\alpha_1$ is the fraction of the current at lower emitter junction $J_1$ which is collected at the center junction $J_2$ and thus the current gain for the PNP transistor portion including lower P type emitter 12.

$\alpha_2$ is the fraction of current at the upper emitter junction $J_3$ which is collected at the center junction $J_2$ and thus current gain for the NPN transistor portion including upper N type emitter layer 14, and $I_{AH}$ is the device current at lower terminal 2 less the base current to drive the transistor including gate emitter junction $J_4$; that is, (2)

$$I_{AH}=I_L+I_g-(1-\alpha_3)I_g$$

where $\alpha_3$ is the fraction of current at the gate emitter junction $J_4$ which is collected at top emitter junction $J_1$ and Ig is gate current.

(3)

$$\therefore I_{AH}=I_L+\alpha_3 I_g$$

Substituting Equation 3 in Equation 1

$$I_L=I_S+\alpha_1(I_L+\alpha_3 I_g)+\alpha_2 I_L$$

$$I_L=\frac{\alpha_1\alpha_2 I_g+I_S}{1-\alpha_1-\alpha_2}$$

Thus, the device turns on when the sum $\alpha_1+\alpha_2\rightarrow 1$. This is the same as for a conventional SCR and occurs as a result of an increase in current density across the two outer emitter junctions $J_1$ and $J_3$ due to an increase in gate current.

FIGURE 5 illustrates the typical voltage current curves of the typical remote gate complementary SCR and the characteristics of the section of pellet 10 illustrated in FIGURE 4. Current is plotted along the axis of ordinates and voltage along the axis of abscissas again with increasing positive voltage on terminal 1 plotted to the right and increasing positive voltage on terminal 2 plotted to the left and positive current flow considered as flow from terminal 1 to 2. In the forward blocking direction for the section of the pellet of FIGURE 4 (positive voltage on main terminal 2), increasing the potential does not increase the device current until the point is reached (Breakover Voltage) where the avalanche condition described above begins to take place. Beyond this point, the current increases rapidly until the total device current is sufficient to maintain the sum of the current gains ($\alpha$'s) greater than or equal to unity. Here the device goes into its high conduction mode.

Again for increasing values of negative gate current, as described above, the region of characteristics between breakover current and holding current is narrowed and the breakover voltage reduced. Thus, it is seen that device characteristics of the two sections of pellet 10 are for all practical purposes the same but shifted 180°. In other words, one section of the pellet 10 conducts for positive voltage at terminal 2 relative to terminal 1 and the other for the reverse polarity. This is reflected in the total device characteristics in FIGURE 6. It is seen that the total characteristic is a composite of the first quadrant of FIGURE 3 and fourth quadrant of FIGURE 5. For sufficiently high gate currents, the entire blocking region is removed in both the first and fourth quadrants of the characteristics, and the device has the voltage-current characteristics of a pair of parallel and oppositely poled PN rectifiers.

One practical way to construct the pellet 10 and one which lends itself to techniques used on SCR production lines is to start with silicon of N conductivity type having a resistivity of 1 to 3 ohm-centimeters (impurity concentration of about $10x(10)^{20}$ atoms/cc.) that ultimately forms the internal N type base layer 11. The initial pellet 10 of FIGURE 1 is 150 mils square and a thickness of approximately 7 mils and the pellet is Boron diffused to a depth of about 1 mil so that P conductivity layers are formed on both sides of the N type layer 11. The P type layer on one side ultimately forms part of the lower P type layler 12, and the other P type layer so formed ultimately forms the upper P type layer 13. As shown, for the SCR portion of the pellet (best seen in FIGURE 2) the P type layer 12 is the layer to which gate contact 19 is ultimately attached.

To complete the pellet 10, it is masked on both sides by conventional masking techniques as, for example, with silicon dioxide. A portion of the oxide mask is removed from the lower major face of the pellet to expose two portions of the lower P type layer 12 for gate region 17 and for lower external layer 20 (lower emitter for SCR portion). A portion of the oxide mask is also removed from the upper surface of pellet 10 to expose a portion of the upper P type layer 13 directly above the portion exposed for formation of gate region 17. This region is exposed for formation of the upper N type region 14 which acts as upper emitter for the remote gate section of FIGURE 4. The portion of pellet 10 exposed for formation of gate region 17 is approximately 25 mils by 150 mils, the portion exposed for upper N type region 14 may be approximately 75 mils by 150 mils and the portion exposed for lower N type region 20 may be 50 mils by 150 mils spaced 25 mils from the pellet edge. The pellet is then phosphorous diffused to a depth of about 0.5 mil to form the upper N type layer 14 and lower N type layers 17 and 20.

Appropriate contacts (15, 16, 18 and 19 of FIGURE 1) are applied by conventional techniques. Here the contacts were all formed by deposition of electroless nickel.

Devices constructed in this manner had breakover voltages in excess of 200 volts and the gate current required to trigger them was from 0.5 to 1.5 milliamperes when considering the triggering modes discussed here. Actually the device is capable of being turned on by a gating signal at the gate region 17 alone for both voltage polarities applied between main terminals 1 and 2. However, without special constructional features the gate current required to turn to device on from gate region 17 (alone) with upper terminal 1 positive relative to lower terminal 2 (called junction gate firing) is about one order of magnitude more than for remote gate firing.

The dual (or complementary structure) of the structure of FIGURE 1 is illustrated in FIGURE 7. By "dual" we mean that the structure is identical but the conductivities of the corresponding regions of the two devices are of opposite types and the voltage-current characteristics of the individual segments as illustrated in FIGURES 2 and 4 are rotated 180°.

These devices may be made by similar techniques and the same general principles apply. Therefore, an elaborate discussion of the operation and structure of the duel is not given here. However, it is noted that to make this device, the initial wafer or pellet 22 is of P conductivity type material which ultimately forms the internal P type base region 23. The lower and upper N type regions 24 and 25 respectively are diffused as described relative to regions 12 and 13 of the device of FIGURE 3, but, of course, N type impurity (such as phosphorous) is used. Finally, the upper P type emitter layer 26 and lower P type layers 27 and 31 may be diffused in by Boron diffusion. Contacts are then applied by conventional techniques as described above. For this structure, a lower shorting contact 28 is applied to lower P region 31 and N region 24, an upper shorting contact 29 is applied to upper P type region 26 and N type region 25. A contact 30 applied to the gate layer 27 and a second gate contact 32 is applied to lower N type layer 24 adjacent lower P type layer 31 conductively remote from the portion of lower contact 28 which is connected to lower N type layer 24.

Many minor modifications in the structure and means of obtaining the structure can be proposed while not departing from the present invention. For example, the internal base region 11 described as the starting material need not be the initial bulk material although this method does allow the device to be made on existing production lines without major changes. Thus, while particular embodiments are illustrated and particular methods of forming these embodiments are described, the invention is not limited thereto. It is contemplated that the appended claims will cover such modifications as fall within the true spirit and scope of the invention.

What I claim as new and desire to secure by Letters Patent of the United States is:

1. A bilateral controllable semiconductor switching device comprising a body of semiconductor material including five layers of one and the opposite conductivity types, layers of one conductivity type being interleaved with layers of the opposite conductivity type forming a plurality of P–N junctions therein, a first main current carrying electrode in low resistance ohmic contact with a surface of an external layer of said body and an exposed surface of an adjacent intermediate layer, a second main current carrying electrode in low resistance ohmic contact with a surface of the other external layer of said body and an exposed surface of an adjacent intermediate layer, a gate region of the same conductivity type as said external layers of said body adjacent said intermediate layer contacted by said first main current carrying electrode, and gating electrode means in ohmic contact with said gate region and with the adjacent intermediate layer to provide for switching the semiconductor device between high and low impedance states for current through said device in opposite senses.

2. A semiconductor switching device comprising a body of semiconductor material including five layers of one and the opposite conductivity type, layers of one conductivity type being interleaved with layers of the opposite conductivity type forming a plurality of P–N junctions therein, a first electrode in low resistance ohmic contact with a surface of an external layer of said body and an exposed surface of an adjacent intermediate layer, a second electrode in low resistance ohmic contact with a surface of the other external layer of said body and an exposed surface of an adjacent intermediate layer, a third electrode connected to one of said intermediate layers, a gate region of the same conductivity type as said external layers adjacent said intermediate layer to which said third electrode is connected, and a fourth electrode connected to said gate region.

3. A semiconductor device as defined in claim 2 wherein said third and fourth electrodes are electrically connected to provide a single device gating terminal for switching said device between high and low impedance states for current through said device in opposite senses.

4. A semiconductor device comprising a body of semiconductor material including five layers of one and the opposite conductivity type, layers of one conductivity type being interleaved with layers of the opposite conductivity type forming a plurality of P–N junctions therein, a first electrode in low resistance ohmic contact with a surface of an external layer of said body and an exposed surface of an adjacent intermediate layer, a second electrode in low resistance ohmic contact with a surface of the other external layer of said body and an exposed surface of an adjacent intermediate layer, a third electrode connected to said intermediate layer contacted by said first electrode at a point conductively remote from said first electrode, a gate region of the same conductivity type as said external layers adjacent the intermediate layer to which said first electrode is connected and adjacent but not contacting the portion of said first electrode connected to said intermediate layer, and a fourth electrode connected to said gate region, said third and fourth electrodes being electrically connected to provide a single device gating terminal for switching said device between high and low impedance states for current through said device in opposite senses.

References Cited by the Examiner

UNITED STATES PATENTS

| | | | |
|---|---|---|---|
| 3,124,703 | 3/1964 | Sylvan | 307—88.5 |
| 3,196,330 | 7/1965 | Moyson | 317—235 |

FOREIGN PATENTS

| | | |
|---|---|---|
| 1,291,321 | 3/1962 | France. |

JOHN W. HUCKERT, *Primary Examiner.*

J. D. KALLAM, R. F. POLISSACK, *Assistant Examiners.*